United States Patent [19]

Choi

[11] Patent Number: 5,753,857
[45] Date of Patent: May 19, 1998

[54] CHARGE COUPLED DEVICE (CCD) SEMICONDUCTOR CHIP PACKAGE

[75] Inventor: Sihn Choi, Choongcheongbuk-do, Rep. of Korea

[73] Assignee: LG Semicon Co., Ltd., Cheongju, Rep. of Korea

[21] Appl. No.: 785,017

[22] Filed: Jan. 17, 1997

[30] Foreign Application Priority Data

Jun. 14, 1996 [KR] Rep. of Korea ............... 21533/1996

[51] Int. Cl.$^6$ .................................................. H01L 23/02
[52] U.S. Cl. ........................ 174/52.4; 361/820; 257/434; 257/680
[58] Field of Search ........................ 174/52.4; 257/433, 257/434, 680, 697, 690, 702, 704, 710, 688, 678; 361/820, 813

[56] References Cited

U.S. PATENT DOCUMENTS 4,751,482  6/1988  Fukuta et al. ............... 333/247
4,868,638  9/1989  Hirata et al. ............... 257/697

Primary Examiner—Hyung S. Sough
Assistant Examiner—Kristina Soderquist
Attorney, Agent, or Firm—Fleshner & Kim

[57] ABSTRACT

A charge coupled device (CCD) semiconductor chip package includes a body having a hole formed in the center thereof and a projection extending inwardly from the inner wall of the body. A plurality of outleads are embedded in the projection, and a plate is attached to the upper surface of the projection. A glass lid is attached to the upper surface of the body for covering the upper portion of the hole. A chip has a light receiving area and a plurality of solder balls, and a bottom cover fills the lower portion of the hole and supports the chip. The CCD package chip employs a direct connection technique of outleads to solder balls formed on chip pads, instead of a wire bonding process, which demands a high temperature environment. By using a price competitive plastic body, material cost is reduced compared to a costly material, such as a ceramic body, when fabricating a semiconductor package. Further, package reliability is enhanced.

18 Claims, 3 Drawing Sheets

1

CHARGE COUPLED DEVICE (CCD) SEMICONDUCTOR CHIP PACKAGE

TECHNICAL FIELD

The present invention relates to a semiconductor package, and more particularly, to a semiconductor chip package for a charge coupled device (hereinafter "CCD").

BACKGROUND ART

Referring to FIG. 1, a conventional CCD semiconductor package includes a recess 2a formed in the center portion of a ceramic body 2 for mounting a chip 4, and outleads 1 provided on each side of the ceramic body 2. A chip 4 has a beam receiver 4a in a portion of the upper surface thereof and is attached by an adhesive member 3 to the bottom surface of the recess 2a. Inner leads 1a and the chip 4 are connected to each other by means of conductive wires 5. A glass lid 7 is attached using an adhesive 6 to the outer surface of the ceramic body 2 so as to cover the recess 2a.

However, the conventional CCD semiconductor package has a couple of disadvantages. The body 2 is formed of a costly ceramic. Further, when performing die and wire bonding, high heat and supersonic wave vibration damage or deform the package material, thereby increasing the time and cost in the package fabrication.

DISCLOSURE OF THE INVENTION

An advantage of the present invention is in reducing the cost for a chip package.

Another advantage of the present invention is in decreasing the fabrication time of a chip package.

Another advantage of the present invention is in providing a CCD package with a plastic body.

Still another advantage of the present invention is in enhancing the reliability of the chip package.

To achieve the above-described object, a CCD semiconductor chip package comprises a body having a large hole formed upwardly and downwardly in the center thereof and a projection formed extendedly from the inner wall of the body to approach inwardly, a plurality of outleads embedded in the projection so that one end portion of each of the plurality of outleads is exposed to the upper surface level of the projection and the other end portion thereof is projected downwardly to a certain level from the lower surface of the body, an inner lead plate having a plate attached to the upper surface of the projection so as to be connected to each end portion of the plurality of outleads and a plurality of inner leads formed extendedly from the plate inwardly, a glass lead attached to the upper surface of the body so as to cover the upper portion of the large hole, a semiconductor chip having a beam receiver formed in the surface thereof and a plurality of solder balls formed on each chip pad thereon, being provided insertingly in the large hole so that each of the plurality of solder balls is connected to the lower surface of the plurality of inner leads, and a bottom cover filling the lower portion of the large hole and supporting the semiconductor chip.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

Figure 1:
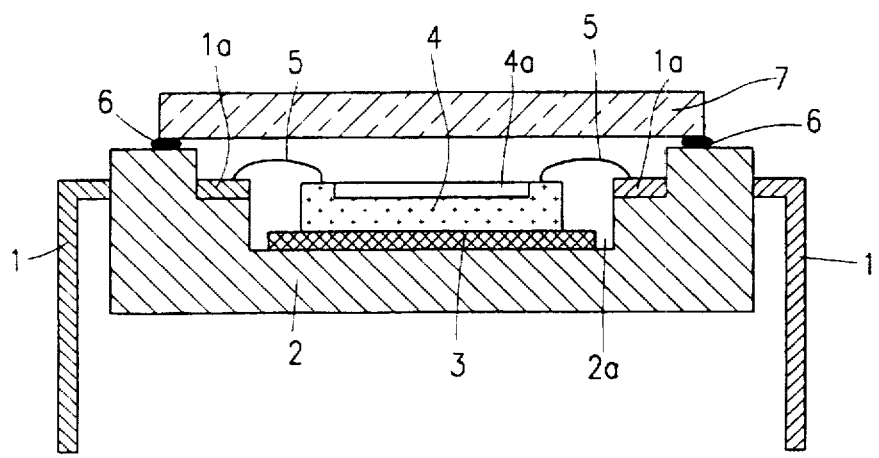
FIG. 1 is a cross-sectional view showing a conventional CCD semiconductor chip package.
Figure 2:
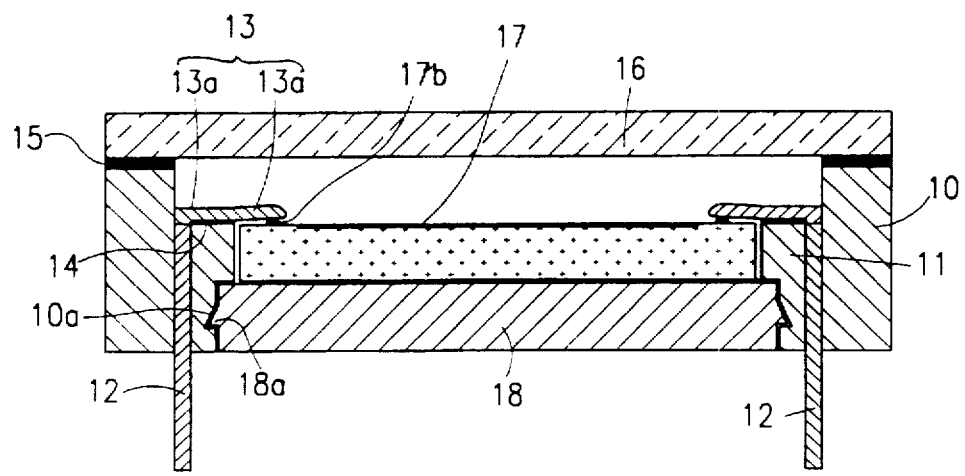
FIG. 2 is a cross-sectional view of a CCD semiconductor chip package in accordance with the present invention.
Figure 3:
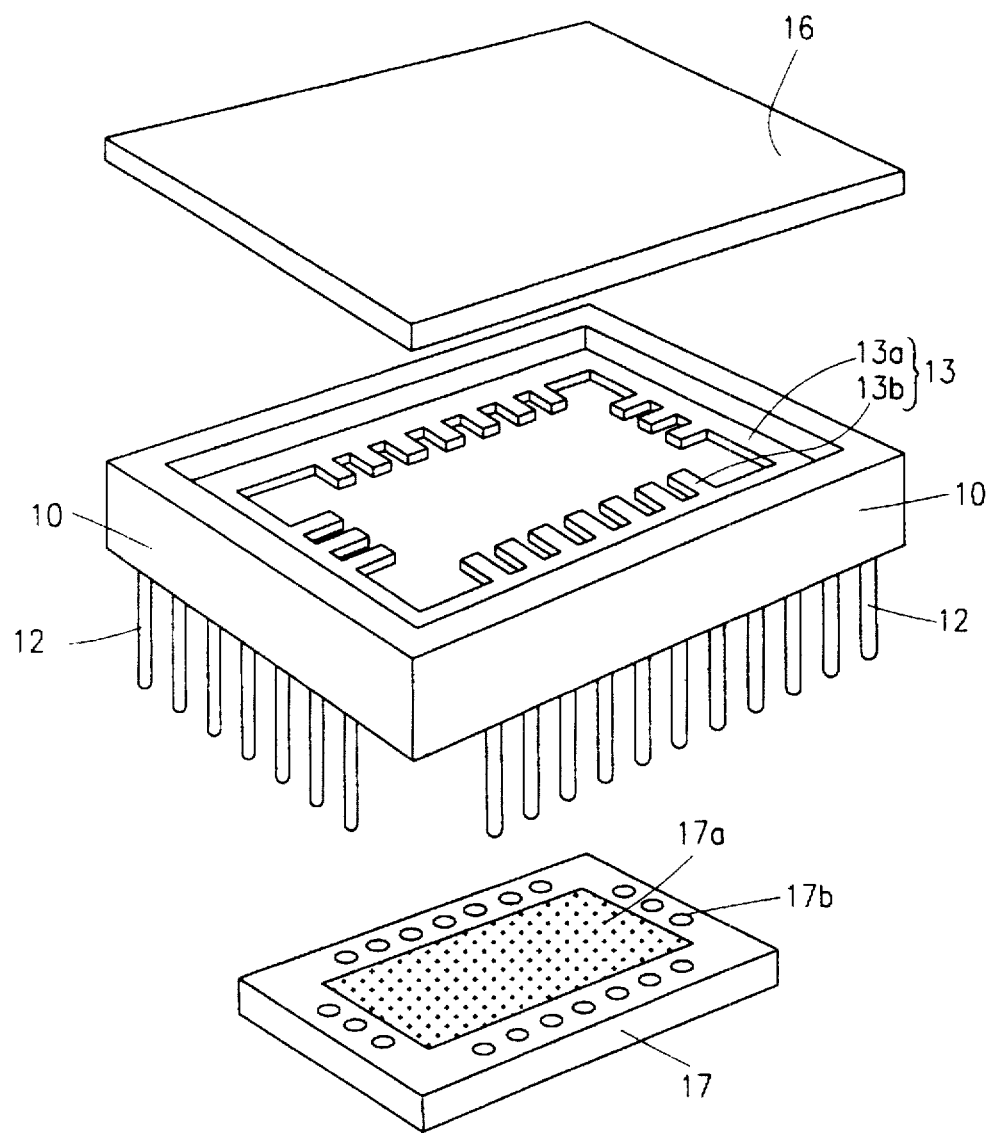
FIG. 3 is a perspective assembly view of the CCD semiconductor chip package in accordance with the present invention.

As shown in FIGS. 2 and 3, a large hole is upwardly and downwardly formed in the center portion of a body 10. A projection 11 is formed extendedly from the inner periphery of the body 10, approaching the center axis of the large hole. A plurality of outleads 12 are insertingly formed in the projection 11. One end portion of each of the outleads 12 is projected outwardly from the lower member of the body 10, and the other end portion thereof becomes exposed on the upper surface level of the projection 11. The body 10 is preferably made of a plastic material.

Figure 4:
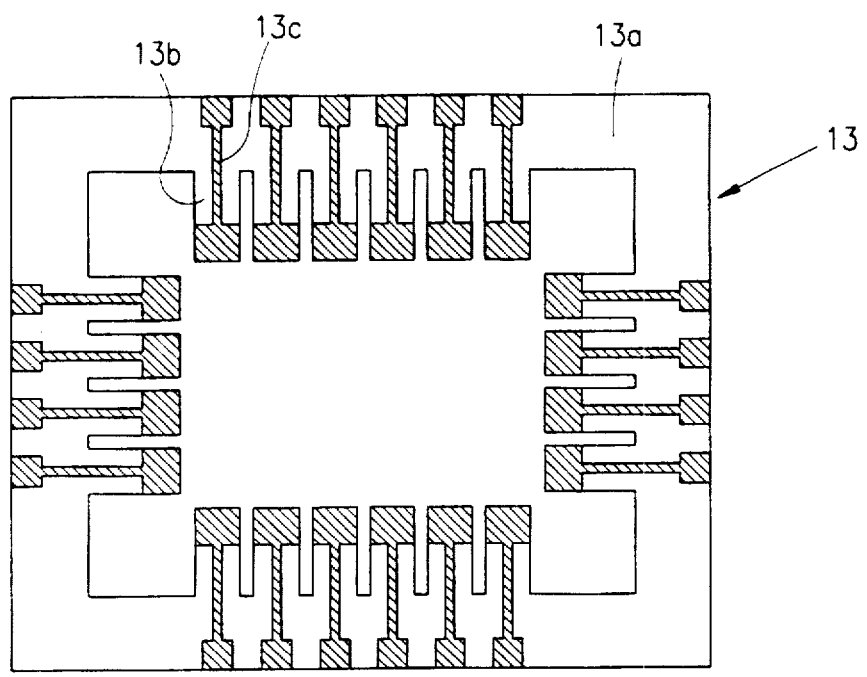
FIG. 4 is a base view of an inner lead plate shown in FIGS. 2 and 3.

A plate 13 is attached to the upper surface of the projection 11 using an adhesive 14. As shown in FIG. 4, the outer portion 13a of the plate 13 is shaped identical to the upper surface of the projection 11, and a plurality of fingers 13b are formed extendedly to a certain length inwardly from the outer portion 13a. The inner lead plate 13 may be formed of a thermosetting resin. As shown in FIG. 4, a conductive thin film pattern 13c has to be formed on the lower surface of the plate 13, so that one end portion of the conductive thin film pattern 13c is electrically connected to each of the outleads 12, which is exposed to the surface level of the projection 11. The other end portion thereof is electrically connected to the solder ball 17b formed on the chip pads, as shown in FIG. 2. As a result, each chip pad formed on the package chip 17 becomes electrically connected to the outleads 12.

After adhering the plate 13 to the upper surface of the projection 11, a glass lid 16 is attached by an adhesive 15 to the upper surface of the body 10 so as to cover the large hole. The body 10 is turned over so as to have the upper surface of the glass lid 16 face downward. The package chip is inserted into the large hole formed in the plastic body 10, with the chip pads and a light receiving area 17a facing downward. The package chip 17 becomes mounted on the fingers 13b extending from the outer portion 13a of the plate 13. Hence, the solder ball, 17b formed on each of the chip pads (not shown) of the package chip 17 is connected to the conductive thin film 13c formed on each surface of the inner leads 13b. Each side surface of the projection 11 is closely fitted to each side surface of the package chip 17 so as to prevent the lateral movement of the package chip 17.

A bottom cover 18 is fittingly inserted into the lower portion of the large hole formed in the plastic body 10 so as to block the lower portion of the large hole, and at the same time, to have the upper surface of the bottom cover 18 supporting the lower surface of the package chip 17. The bottom cover 18 also slightly pushes up the package chip 17, and accordingly, the fingers 13b become bent upwardly in accordance with the force loaded on the package chip 17. The rebouncing force generated by the elasticity of the inner leads 13b, which was pushed up, enables each of the solder balls 17b and the conductive thin film 13c to securely contact each other.

Meanwhile, a saw shaped recess 10a and a saw shaped protrusion 18a are respectively formed in the inner lower periphery of the projection 11 and on the outer periphery of the bottom cover 18, respectively, to function as a locking mechanism. Once the bottom cover 18 is inserted into the lower portion of the large hole, the recess 10a and protrusion 18a engages one another to prevent the vertical movement of the bottom cover 18 from the body 10. The bottom cover 18 may be made of a thermosetting resin material.

As described above, the CCD semiconductor package chip in accordance with the present invention enables employing a direct connection technique of outleads to solder balls formed on chip pads, instead of a wire bonding process which demands a high temperature environment. The use of a plastic body reduces material cost, compared to a ceramic body, which is costly, when fabricating a semiconductor package. The fabrication steps is simplified, the material cost is significantly reduced, and package reliability is enhanced.

The foregoing embodiment is merely exemplary and not to be construed as limiting the present invention. The present scheme can be readily applied to other types of devices other than CCD. The description of the present invention is intended to be illustrative, and not limiting the scope of the claims. Many alternatives, modifications and variations will be apparent to those skilled in the art.

I claim:

1. A semiconductor chip package, comprising:

a body having a hole formed in the center thereof and a projection extending inwardly from the peripheral inner wall of said body;

a plurality of outleads each having two end portions embedded in said projection, where a first end portion of each of the plurality of outleads is exposed to an upper surface level of said projection and the other end portion of each of the plurality of outleads is projected downwardly to a certain level from the lower surface of the body;

a plate having an outer portion attached to the upper surface of said projection so as to be connected to each first end portion of the plurality of outleads and a plurality of fingers extending inwardly from said plate;

a glass lid attached to the upper surface of the body so as to cover an upper portion of said hole;

a semiconductor chip having a light receiving area formed in a surface thereof and a plurality of solder balls formed on each chip pad thereon, being provided insertingly in said hole so that each of the plurality of solder balls is connected to the lower surface of the plurality of fingers; and a bottom cover filling a lower portion of said hole and supporting said semiconductor chip.

2. The chip package of claim 1, wherein said plate is formed of a thermosetting resin.

3. The chip package of claim 1, wherein a plurality of conductive thin film patterns each having two end portions are formed on the lower surface of said plate, so that one end portion of each of the plurality of thin film patterns is connected to each of the plurality of out leads and the other end portion of each of the plurality of thin film patterns is connected to each of the plurality of solder balls.

4. The chip package of claim 1, wherein said body is formed of a plastic material.

5. The chip package of claim 1, wherein said bottom cover is formed of a plastic material.

6. The chip package of claim 1, wherein a saw shaped recess and protrusion are formed in an inner lower periphery of said body and on an outer periphery of said bottom cover, respectively.

7. A chip package, comprising:

an integrated chip having a plurality of conductive media;

a body having a projection with a plurality of leads each having two end portions embedded therein, said projection defining a space for receiving said integrated chip and each first end of said plurality of leads being exposed on a surface of said projection;

a plate having a portion mounted on the surface of said projection, a plurality of finger-like extensions protruding form the portion, and a plurality of conductive films, each conductive film extending from one of said finger-like extensions to said portion such that said plurality of conductive films is in contact with each of the first ends of said plurality of leads when said plate is mounted on the surface of said projection; and a first cover mounted on said body, wherein said integrated chip is inserted into the space such that corresponding ones of said plurality of conductive media contact corresponding ones of said plurality of conductive films for conductive connection with said leads.

8. The package of claim 7, further comprising a second cover inserted into the space.

9. The package of claim 8, further comprising means for locking said second cover into the space defined by said projection.

10. The package of claim 9, wherein said locking means comprises a saw shaped recess formed on said projection and a saw shaped protrusion formed on said second cover such that said recess and said projection securely interlock with one another.

11. The package of claim 8, wherein said plurality of finger-like extensions are elastically bent in the direction of said first cover when said second cover is inserted into said space.

12. The package of claim 7, wherein said integrated chip is a charged coupled device with a light receiving area, and said first cover allows light to enter the package for reception by said light receiving area.

13. The package of claim 7, wherein said first cover is a light transparent lid.

14. The package of claim 7, wherein said plurality of leads extends beyond the lower surface of the body.

15. The package of claim 7, wherein said plate is made from a thermosetting resin.

16. The package of claim 7, wherein said body is made from a plastic material.

17. The package of claim 8, wherein said second cover is made from a plastic material.

18. The package of claim 7, wherein said plurality of conductive media is a plurality of solder balls.

* * * * *